(12) United States Patent
Chen

(10) Patent No.: US 11,723,185 B2
(45) Date of Patent: Aug. 8, 2023

(54) CAPACITOR STRUCTURE, METHOD FOR MANUFACTURING SAME, AND MEMORY

(71) Applicant: CHANGXIN MEMORY TECHNOLOGIES, INC., Hefei (CN)

(72) Inventor: WenLi Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 259 days.

(21) Appl. No.: 17/369,114

(22) Filed: Jul. 7, 2021

(65) Prior Publication Data

US 2022/0052053 A1 Feb. 17, 2022

Related U.S. Application Data

(63) Continuation of application No. PCT/CN2021/075069, filed on Feb. 3, 2021.

(30) Foreign Application Priority Data

Aug. 13, 2020 (CN) .......................... 202010809896.3

(51) Int. Cl.
   *H01L 27/108* (2006.01)
   *H01L 49/02* (2006.01)
   *H10B 12/00* (2023.01)

(52) U.S. Cl.
   CPC ......... *H10B 12/0335* (2023.02); *H01L 28/60* (2013.01); *H10B 12/30* (2023.02)

(58) Field of Classification Search
   CPC .. H10B 12/0335; H10B 12/30; H10B 12/033; H01L 28/60; H01L 28/90
   See application file for complete search history.

(56) References Cited

U.S. PATENT DOCUMENTS 7,413,950 B2  8/2008  Kim
9,349,724 B2  5/2016  Kim et al.
(Continued)

FOREIGN PATENT DOCUMENTS

CN    108110025 A    6/2018
CN    209785930 U   12/2019

OTHER PUBLICATIONS

International Search Report in the international application No. PCT/CN2021/075069, dated May 18, 2021, 5 pgs.
(Continued)

*Primary Examiner* — David Vu
(74) *Attorney, Agent, or Firm* — Cooper Legal Group, LLC

(57) ABSTRACT

The present application relates to a capacitor structure and a method for manufacturing the same, and a memory using the capacitor structure. The method includes the following operations: a substrate is provided; a stacked structure is formed on the substrate, the stacked structure including at least two support material layers arranged at an interval and a sacrificial material layer located between adjacent support material layers; capacitance holes is formed in the stacked structure, each of the capacitance holes including at least three through holes arranged in isolation; a lower electrode is formed, the lower electrode at least covering a side wall and a bottom of each through hole; the sacrificial material layer is removed, and a capacitance dielectric layer is formed on a surface of the lower electrode; and an upper electrode is formed on a surface of the capacitance dielectric layer.

20 Claims, 23 Drawing Sheets

(56) References Cited

U.S. PATENT DOCUMENTS

| | | | |
|---|---|---|---|
| 2007/0170487 A1* | 7/2007 | Heitmann | H01L 28/91 438/399 |
| 2010/0187101 A1 | 7/2010 | Kim et al. | |
| 2011/0062552 A1* | 3/2011 | Tsuchiya | H10B 12/315 257/532 |
| 2020/0006345 A1 | 1/2020 | Choo et al. | |
| 2020/0083317 A1 | 3/2020 | Huang et al. | |

OTHER PUBLICATIONS

Supplementary European Search Report in the European application No. 21773273.4, dated Jul. 5, 2022, 7 pgs.

\* cited by examiner

CAPACITOR STRUCTURE, METHOD FOR MANUFACTURING SAME, AND MEMORY

CROSS-REFERENCE TO RELATED APPLICATION

The present application is a U.S. continuation application of International Application No. PCT/CNN2021/075069, filed on Feb. 3, 2021, which claims priority to Chinese Patent Application No. 202010809896.3, filed on Aug. 13, 2020. International Application No. PCT/CNN2021/075069 and Chinese Patent Application No. 202010809896.3 are incorporated herein by reference in their entities.

TECHNICAL FIELD

The disclosure relates to the technical field of semiconductor memories, and particularly to a capacitor structure and a method for manufacturing the same, and a memory.

BACKGROUND

Dynamic Random Access Memory (DRAM) includes a capacitor for storing charges and a transistor for accessing the capacitor. The DRAM stores data in the form of charges on the capacitor, so it is necessary to recharge the capacitor regularly every several milliseconds. The larger the capacitance of the capacitor, the longer the data that can be maintained in the DRAM.

As can be seen from capacitance formulas, with the same dielectric material having a high dielectric constant, if there is a need to increase the capacitance, it can only increase the surface area and/or decrease the thickness of the dielectric material layer. However, with miniaturization of the size of the semiconductor memory, it is becoming more and more difficult to achieve the same capacitance or achieve a larger capacitance by increasing the surface area.

SUMMARY

According to various examples of the disclosure, a capacitor structure and a method for manufacturing the same, and a memory are provided.

To achieve the above-mentioned objective, the disclosure provides a method for manufacturing a capacitor structure, which includes the following operations.

A substrate is provided.

A stacked structure is formed on the substrate, the stacked structure including at least two support material layers arranged at an interval and a sacrificial material layer located between adjacent support material layers.

Capacitance holes are formed in the stacked structure, each of the capacitance holes including at least three through holes arranged in isolation.

A lower electrode is formed, the lower electrode at least covering a side wall and a bottom of each of the through holes.

The sacrificial material layer is removed, and a capacitance dielectric layer is formed on a surface of the lower electrode.

An upper electrode is formed on a surface of the capacitance dielectric layer.

The examples of the disclosure further provide a capacitor structure, which may include: a substrate; a support layer, located on a surface of the substrate, and at least including a top support material layer and a bottom support material layer, multiple capacitance holes being arranged in the support layer, and each of the capacitance holes including at least three through holes arranged in isolation; a lower electrode, located between the top support material layer and the bottom support material layer, and at least covering a side wall and a bottom of the each of the through holes; a capacitance dielectric layer, at least located on a surface of the lower electrode; and an upper electrode, located on a surface of the capacitance dielectric layer.

The examples of the disclosure further provide a memory, which uses the capacitor structure as described in any of the above examples.

One or more examples of the disclosure are proposed in the following accompanying drawings and descriptions in details. Other features, objectives, and advantages of the disclosure will be apparent in the descriptions, accompanying drawings and claims.

BRIEF DESCRIPTION OF THE DRAWINGS

In order to more clearly illustrate the examples of the disclosure or technical solutions in conventional technology, the accompanying drawings required in examples of the disclosure or technical solutions in conventional technology will be further described briefly below. It is apparent that the drawings illustrated in the following description only show some examples of the disclosure. Those skilled in the art can also obtain other drawings according to these drawings without any creative work.

In the figures.

substrate—100, stacked structure—200, second concave pattern—200a, bottom support material layer—210, first sacrificial material layer—220, intermediate support material layer—230, second sacrificial material layer—240, top support material layer—250, opening—250a, lower electrode—300, capacitance dielectric layer—400, upper electrode—500, capacitance contact pad—600, first hard mask layer—710, first concave pattern—710a, filling layer—800, first strip pattern—720, second organic mask material layer—721, second hard mask material layer—722, second strip pattern—730, third organic mask material layer—731, third hard mask material layer—732, capacitance hole—900, through hole—910.

DETAILED DESCRIPTION

Hereafter, the disclosure will be described more fully with reference to the accompanying drawings in order to facilitate an understanding of the disclosure. Examples of the disclosure are shown in the accompanying drawings. However, the disclosure may be implemented in many different forms and is not limited to the examples described herein. Rather, the purpose of providing these examples is to make the contents of the disclosure more thorough and comprehensive.

Unless otherwise defined, all technical and scientific terms used in the specification have a same meaning generally understood by a person skilled in the art to which the disclosure belongs. The terms used in the specification of the disclosure are merely to describe the specific examples, rather than to limit the disclosure.

Figure 1:
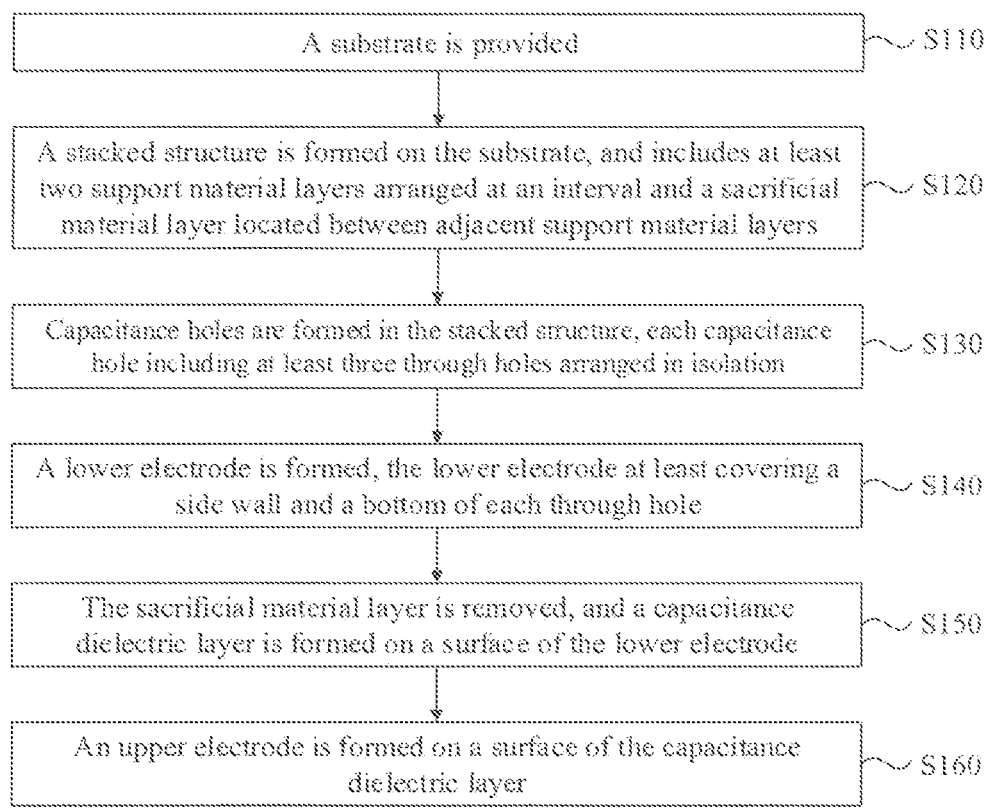
FIG. 1 illustrates a flowchart of a method for manufacturing a capacitor structure according to one or more examples.

Referring to FIG. 1, and in combination with FIG. 2 to FIG. 15, a method for manufacturing a capacitor structure is provided according to one or more examples of the disclosure. The method may include the following operations.

At Step S110, a substrate 100 is provided.

At Step S120, a stacked structure 200 is formed on the substrate 100. The stacked structure 200 includes at least two support material layers arranged at an interval and a sacrificial material layer located between adjacent support material layers.

At Step S130, capacitance holes are formed in the stacked structure 200. Each of the capacitance holes 900 includes at least three through holes 910 arranged in isolation.

At Step S140, a lower electrode 300 is formed, and the lower electrode 300 at least covers a sidewall and a bottom of each of the through holes 910.

At Step S150, the sacrificial material layer is removed, and a capacitance dielectric layer 400 is formed on a surface of the lower electrode 300.

At Step S160, an upper electrode 500 is formed on a surface of the capacitance dielectric layer 400.

It is to be understood that the existing DRAM is mainly of a 6F2 structure. The capacitance structure is mainly the stacked capacitor. With the increasingly small size, such a structure cannot meet requirements of the DRAM on the capacitance. In view of this, by forming the capacitance holes 900 having multiple through holes 910 arranged in isolation, and forming the lower electrode 300 at least covering the side wall and the bottom of each of the through holes 910, the disclosure increases the surface area of the lower electrode 300, and can increase the relative area between the lower electrode 300 and the upper electrode 500, thereby increasing the capacitance of the capacitor. Then, by removing the sacrificial material layer 220 to expose sidewall at either side of the lower electrode 300, and sequentially forming the capacitance dielectric layer 400 and the upper electrode 500 on a side surface of the lower electrode 300, the disclosure makes the upper electrode 500, the capacitance dielectric layer 400 and the lower electrode 300 jointly form a double-sided capacitance structure, and further increases the relative area between the lower electrode 300 and the upper electrode 500, thereby increasing the capacitance of the capacitor.

In the example, the substrate may include a silicon substrate, an epitaxial silicon substrate a silicon-germanium substrate, a silicon carbide substrate or a silicon coated insulating substrate, but is not limited thereto. Those skilled in the art may select the type of the semiconductor substrate according to the semiconductor device formed on the substrate as required, so the type of the semiconductor substrate should not limit the scope of protection of the disclosure. In the example, the substrate is a P-type crystalline silicon substrate.

The substrate 100 includes a base and a shallow trench structure (not illustrated) formed in the base. Through the shallow trench structure, multiple active regions (not illustrated) that are parallel and staggered are defined; and an insulating material is filled in the shallow trench structure to form a shallow trench isolation structure. The substrate 100 further includes a word line structure (not illustrated) and a bit line structure (not illustrated). The word line structure is of a buried type word line structure. The extension direction of the buried type word line structure is crossed with the extension direction of the bit line structure. In addition, a capacitance contact plug (not illustrated) is further disposed on the substrate 100. The capacitor structure is electrically connected to the substrate 100 through the capacitance contact plug.

Figure 2:
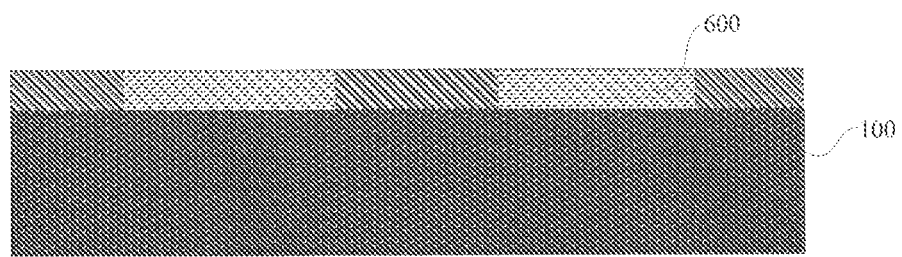
FIG. 2 to FIG. 15 illustrate a structural schematic diagram of a capacitor structure formed gradually according to one or more examples.

Referring to FIG. 2, in order to reduce the contact resistance between the capacitor structure and the capacitance contact plug, before the stacked structure 200 is formed, the method for manufacturing the capacitor structure may further include the following step.

Capacitance contact pads 600 are formed on the substrate 100, in which the capacitance contact pads 600 correspond to the capacitance holes 900 one by one.

In the example, a spacing layer is formed on the substrate 100. Openings penetrating through the spacing layer are first formed in the spacing layer through a patterning process. The capacitance contact pads 600 are defined through the openings. Then, a conductive material, such as one or any combination of titanium nitride, titanium, copper, tungsten, tungsten silicate and tungsten nitride, is deposited by using a deposition process to form a capacitance contact material layer. The capacitance contact material layer fills up the opening and covers a surface of the spacing layer. The deposition process may include Chemical Vapor Deposition (CVD), Low Pressure CVD (LPCVD), Plasma Enhancing CVD (PECVD), Atomic Layer Deposition (ALD), Plasma Enhancing ALD (PEALD), etc. Next, the capacitance contact material layer on a top of the spacing layer is removed by using an etching or a chemical polishing process, and a retaining capacitance contact material layer serves as the capacitance contact pads 600. In the example, the tungsten is used to manufacture the capacitance contact pads 600.

Figure 3:
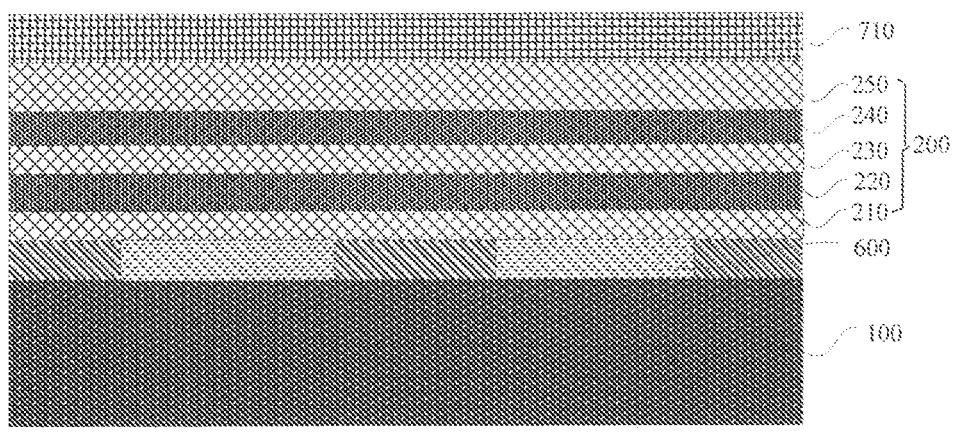

Referring to FIG. 3, after the capacitance contact pads 600 are formed, the stacked structure 200 is formed on the surface of the substrate 100 by using the deposition process. It is to be understood that in order to avoid a warp or collapse phenomenon of the lower electrode 300 after the sacrificial material layer is removed, the stacked structure 200 in the example is provided with a top support material layer, a bottom support material layer and at least one intermediate support material layer, and the sacrificial material layer is formed between the top support material layer 250 and the intermediate support material layer as well as the intermediate support material layer and the bottom support material layer. The added intermediate support material layer increases the support effect for the lower electrode 300. In the example, the stacked structure 200 includes an intermediate support layer, with the specific forming process including that: the bottom support material layer 210, the first sacrificial material layer 220, the intermediate support material layer 230, the second sacrificial material layer 240 and the top support material layer 250 are sequentially formed by the deposition process. The support material, such as silicon nitride, silicon oxynitride and other insulating material, is deposited by using the CVD process on the substrate 100 formed with the capacitance contact pads 600, so as to form the bottom support material layer 210, the intermediate support material layer 230 and the top support material layer 250; and an insulating material having a large relative etching ratio with the support material layer 210 is deposited by using the CVD process to form the first sacrificial material layer 220 and the second sacrificial material layer 240. In the example, the support material layer 210 is formed with the silicon nitride, and the bottom material layer is formed with the silicon oxide. Therefore, by subsequently selecting an appropriate etching condition, the etching rate of the sacrificial material layer is more than that of the support material layer in the etching process to avoid the damage of the support material layer.

After the stacked structure 200 is formed, the next step is to manufacture the capacitance holes 900 in the stacked structure 200. In an example, the step that the capacitance hole 900 is formed in the stacked structure 200 may include the following steps.

A first hard mask layer 710 is formed on the stacked structure 200, the first hard mask layer 710 forming a first concave pattern 710*a*, and the first concave pattern 710*a* defining an external outline of the capacitance hole 900.

A filling layer 800 is formed, the filling layer 800 covering a surface of the first hard mask layer 710 and filling up the first concave pattern 710*a*.

A first strip pattern 720 and a second strip pattern 730 that overlap are formed on the filling layer 800, and an overlapping portion between the first strip pattern 720 and the second strip pattern 730 is located above the first concave pattern 710*a*.

The filling layer 800, the first hard mask layer 710 and the stacked structure 200 are etched based on the first concave pattern 710*a*, the first strip pattern 720 and the second strip pattern 730, till the stacked structure 200 is removed for a preset height, and a second concave pattern defining the capacitance hole 900 is formed in the stacked structure 200.

The filling layer 800 is etched based on the second concave pattern to form the capacitance hole 900.

It is to be understood that while the size is reduced gradually, the second concave pattern cannot be formed by performing a patterning process once due to limitations of the etching process and precision. In view of this, in the example, the stacked structure 200 is etched based on multiple patterns, till the stacked structure 200 is removed for the preset height, and the second concave pattern defining the capacitance hole 900 is formed in the stacked structure 200.

In the process of forming the capacitance contact hole, the first hard mask layer 710 is first formed on the substrate 100. In an example, forming the first hard mask layer 710 may include the following steps.

A first hard mask material layer, a first organic mask material layer and a first photoresist layer are formed on a surface of the stacked structure 200.

The first photoresist layer is patterned, and a target pattern defining the first concave pattern 710*a* is formed in the first photoresist layer.

The first organic mask material layer and the first hard mask material layer are etched with the first photoresist layer as a mask, a retaining first hard mask material layer forming the first hard mask layer 710.

The first organic mask material layer and the first photoresist layer are removed.

Figure 4A:
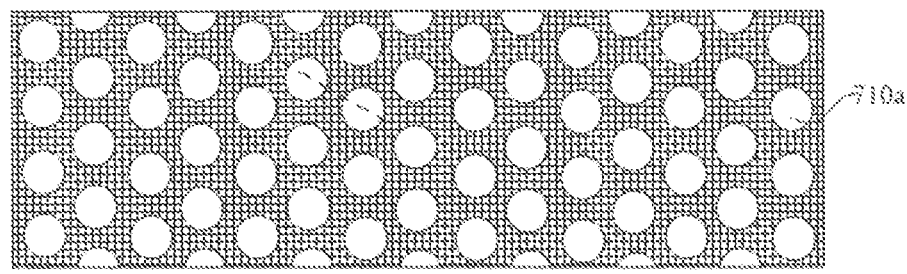
Figure 4B:
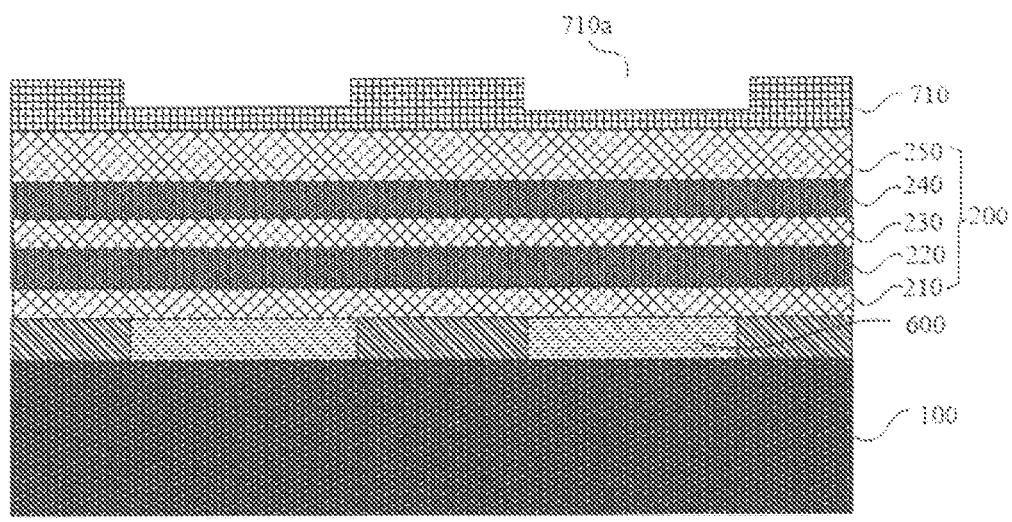

Referring to FIG. 4A and FIG. 4B, FIG. 4A illustrates a top view of the capacitor structure after the first hard mask layer 710 is formed, and FIG. 4B is a sectional view of a capacitor structure after the first hard mask layer 710 is formed. In the example, the specific process for manufacturing the first hard mask layer 710 includes the following steps.

1) The first hard mask material layer and the first organic mask material layer are formed on the surface of the stacked structure 200, and a photoresist is coated on the first organic mask material layer to form the first photoresist layer. The first hard mask material layer may be made by nitride, oxide or silicon material such as silicon oxynitride, silicon oxide, polysilicon, and the like, and the first organic mask material may be an anti-reflection material, an organic carbon material and the like. In the example, the polysilicon is selected to manufacture the first hard mask material layer, and the organic carbon material is selected to manufacture the first organic mask material layer.

2) The first photoresist layer is subjected to exposure, cleaning and other steps to form a target pattern defining the first concave pattern 710*a*.

3) The first organic mask material layer and the first hard mask material layer are etched with the first photoresist layer as the mask. The first concave pattern 710*a* is unnecessarily too deep, which may be achieved by etching to remove a part of the height of the first hard mask material layer.

4) At last, the first organic mask material layer and the first photoresist layer are moved with an organic solvent, and the retaining first hard mask material layer forms the first hard mask layer 710. Multiple regularly arranged first concave patterns 710*a* are formed in the first hard mask layer 710.

In an example, the first concave pattern 710*a* has a cross section of circular, and lines for connecting centers of three first concave patterns 710*a* adjacent to each other form an equilateral triangle. It is to be understood that the first concave pattern 710*a* has the cross section of circular, and the lines for connecting the centers of the three first concave patterns 710*a* adjacent to each other form the equilateral triangle, such that when all first concave patterns 710*a* most adjacent to the same first concave pattern 710*a* are arranged in a regular hexagon, the diameter of the capacitance structure in the capacitor structure is increased, and thus the capacitance of the capacitor structure is increased. In addition, the cross section of the first concave pattern 710*a* may further be in other shapes, and is not limited thereto by the example.

Figure 5:
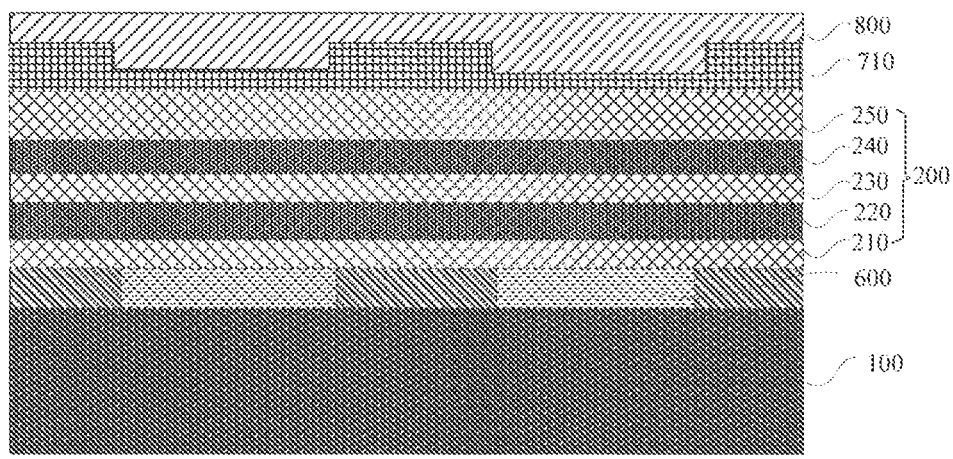

Referring to FIG. 5, after the first concave pattern 710*a* is formed, in order to facilitate the formation of the first strip pattern 720 and the second strip pattern 730, there is a need to form a relatively flat surface above the first hard mask layer 710. In view of this, in the example, after the first hard mask layer 710 is formed, the filling layer 800 is formed by depositing a filling material, the filling layer 800 covering the surface of the first hard mask layer 710 and filling the first concave pattern 710*a*. In the example, the filling layer 800 is manufactured with the silicon nitride material.

Then, the first strip pattern 720 and the second strip pattern 730 are sequentially formed on the filling layer 800 by the patterning process. In an example, the step that the first strip pattern 720 and the second strip pattern 730 are formed may include the following steps.

A second organic mask material layer 721 and a second hard mask material layer 722 are sequentially formed on the filling layer 800.

The second hard mask material layer 722 is patterned to form the first strip pattern 720 extending in a first direction.

A third organic mask material layer 731 and a third hard mask material layer 732 are sequentially formed on the second hard mask material layer 722.

The third hard mask material layer 732 is patterned to form the second strip pattern 730 extending in a second direction, in which there is a included angle between the first direction and the second direction.

In the example, the process that the first strip pattern 720 and the second strip pattern 730 are formed above the first hard mask layer 710 having the first concave pattern 710*a* may specifically include the following steps.

In the first step, the second organic mask material layer 721 and the second hard mask material layer 722 are sequentially formed on the filling layer 800. The material for manufacturing the second hard mask material layer 722 may be nitride and oxide, such as silicon oxynitride, silicon oxide, etc. The second organic mask material layer 721 may be made of the anti-reflection material, the organic carbon material, etc. In the example, the silicon oxynitride is selected to manufacture the second hard mask material layer 722, and the organic carbon material is selected to manufacture the second organic mask material layer 721.

Figure 6:
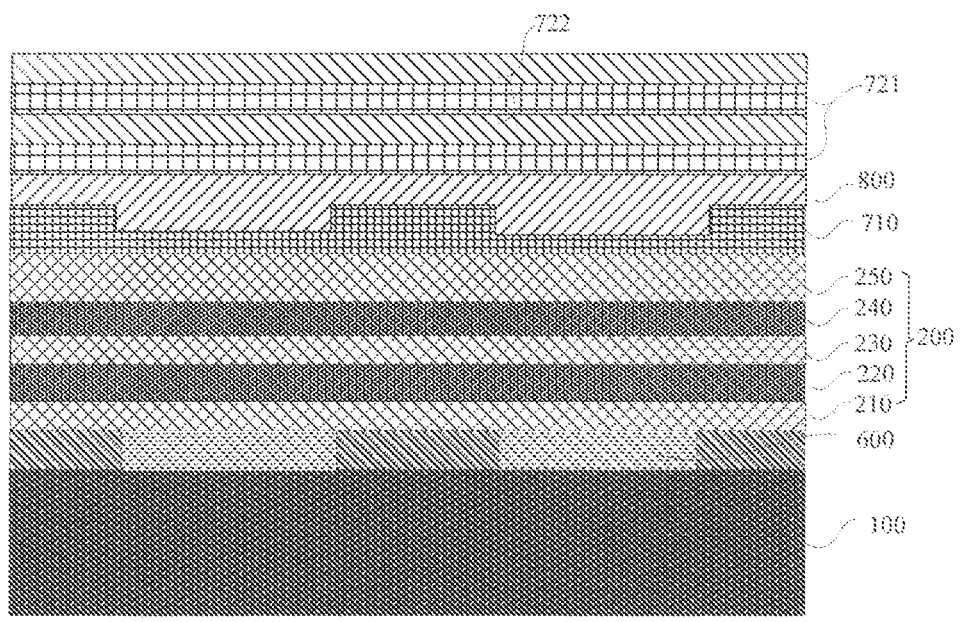

In addition, in order to meet requirements on line width, the step that the second organic mask material layer 721 and the second hard mask material layer 722 are formed is repeated with a Self-aligned Double Patterning (SADP) process in the example, to form the second hard mask layer having two second organic mask material layers 721 and two second hard mask material layers 722, as shown in FIG. 6.

Figure 7A:
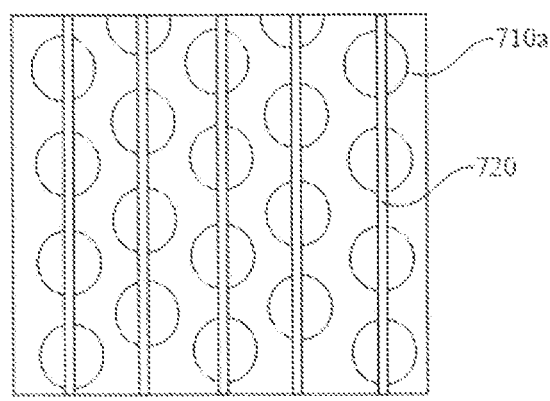
Figure 7B:
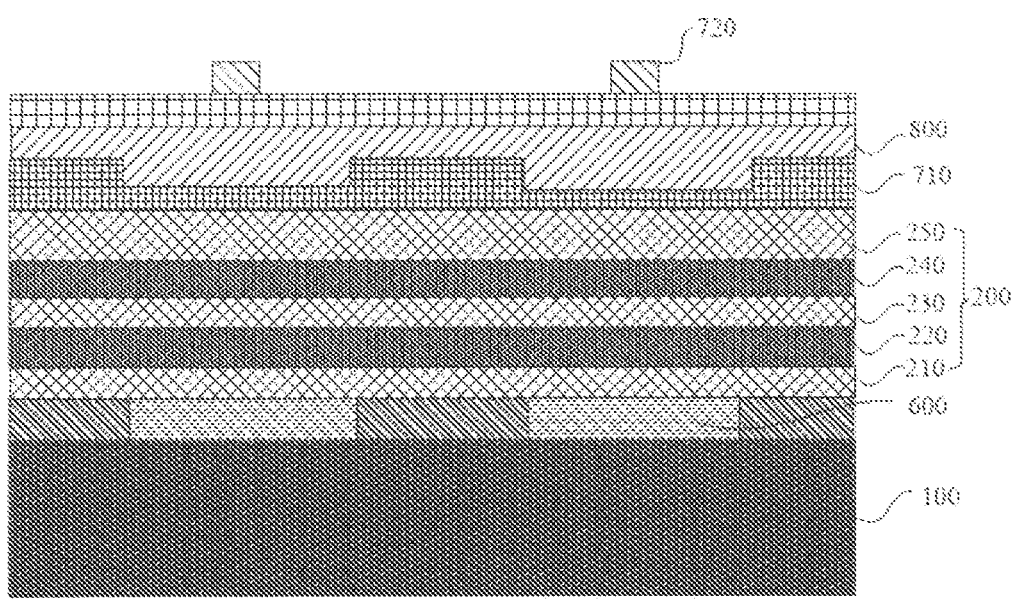

In the second step, the second hard mask material layer 722 is patterned to form the first strip pattern 720 extending in the first direction, as shown in FIG. 7A and FIG. 7B. FIG. 7A is a schematic diagram of relative positions of the first strip pattern 720 and the first concave pattern 710a, and FIG. 7B is a sectional view of the capacitor structure after the first strip pattern 720 is formed. The second step specifically includes that the following operations. A second photoresist layer is formed on the second hard mask material layer 722, and the second photoresist layer is subjected to the exposure, cleaning and other steps to form the target pattern defining the first strip pattern 720. Then, the first strip pattern 720 extending in the first direction is formed in the second hard mask material layer 722 with the SADP process. The first strip pattern 720 is located above the first concave pattern 710a.

In the third step, the third organic mask material layer 731 and the third hard mask material layer 732 are sequentially formed on the second hard mask material layer 722. In the example, the third organic mask material layer 731 and the second organic mask material layer 721 are made of the same material, and the third hard mask material layer 732 and the second hard mask material layer 722 are made of the same material, so as to facilitate material management and reduction of production cost. In addition, as the polysilicon, silicon nitride and silicon oxynitride in the etching process have a large etching selection ratio, when the polysilicon, silicon nitride and silicon oxynitride are used to form the first hard mask layer, the filling layer, the second hard mask material layer 722 and the third hard mask material layer 732 in the example, an etching stop layer may be provided according to the etching selection ratio to transfer the pattern layer by layer.

Figure 8A:
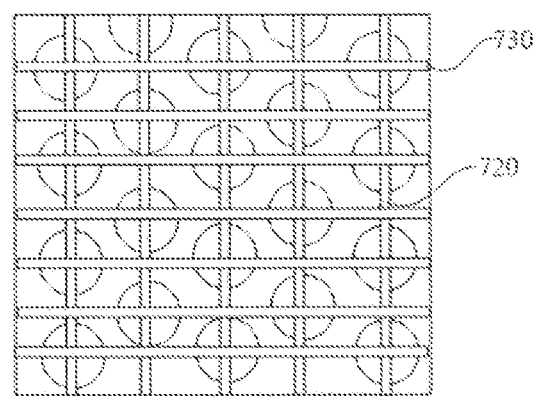
Figure 8B:
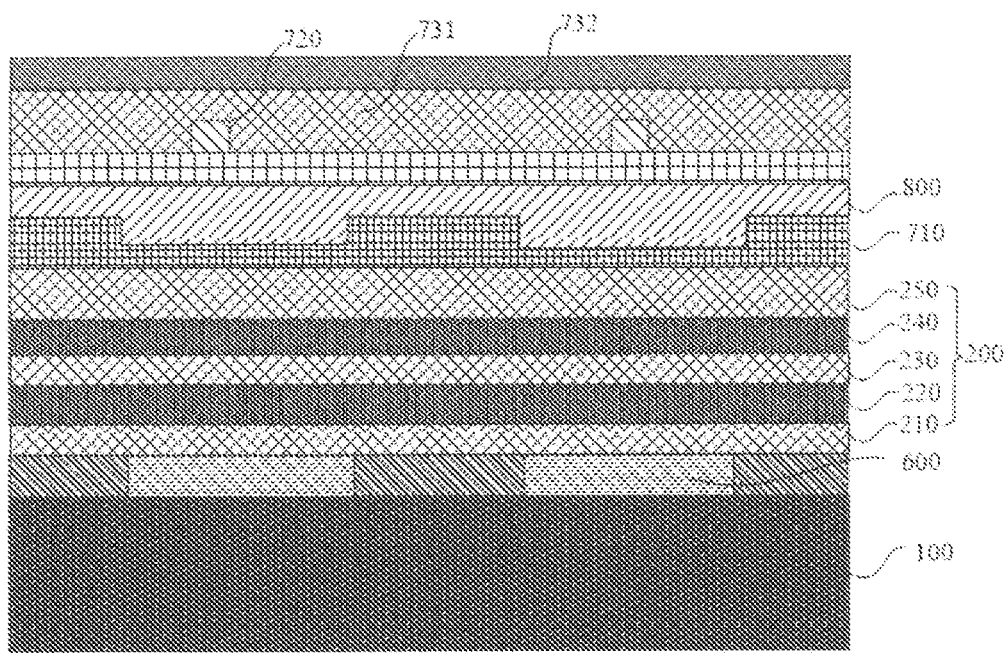

In the fourth step, the third hard mask material layer 732 is patterned to form the second strip pattern 730 extending in the second direction. Referring to FIG. 8A and FIG. 8B, FIG. 8A is a schematic diagram of relative positions among the second strip pattern 730, the first strip pattern 720 and the first concave pattern 710a, and FIG. 8B is a sectional view of the capacitor structure after the second strip pattern 730 is formed. The step may include that: a third photoresist layer is formed on the third hard mask material layer 732, and the third photoresist layer is subjected to the exposure, cleaning and other steps to form the target pattern defining the second strip pattern 730. Then, with the third photoresist layer having the target pattern of the second strip pattern 730 as a mask, the target pattern of the second strip pattern 730 is transferred to the third hard mask material layer 732, to form the second strip pattern 730 extending in the second direction in the second hard mask material layer 722. The first strip pattern 720 is located right above the first concave pattern 710a, and an overlapping portion between the first strip pattern 720 and the second strip pattern 730 is located right above the first concave pattern 710a. In the example, the first direction and the second direction are perpendicular to each other.

Figure 9A:
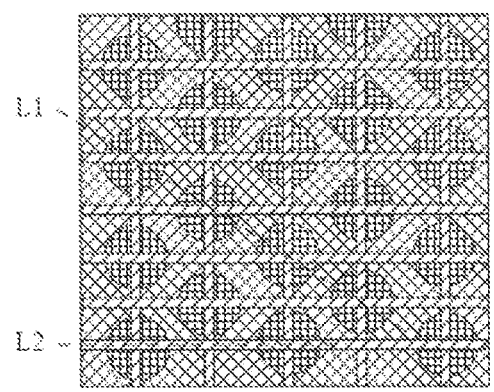
Figure 9B:
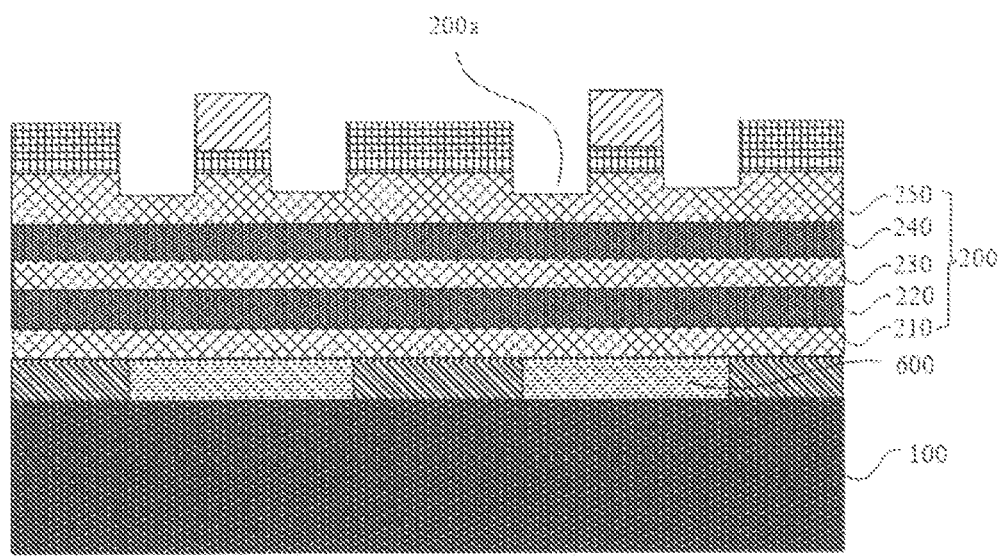
Figure 9C:
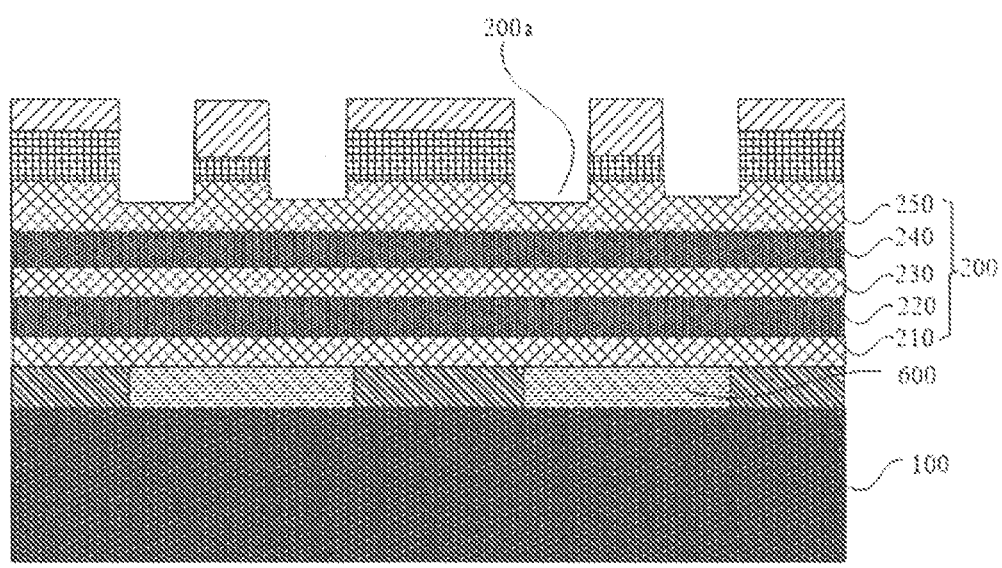
Figure 10:
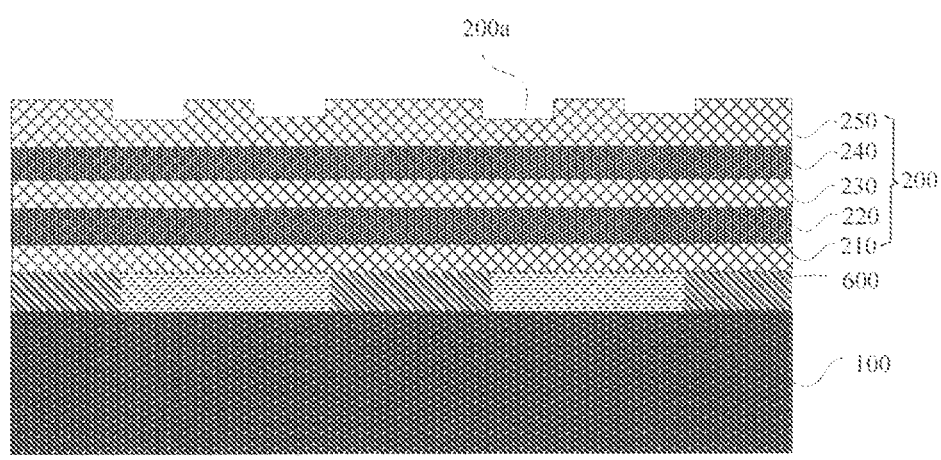

After the first strip pattern 720 and the second strip pattern 730 are formed, the filling layer 800 is etched based on the first strip pattern 720 and the second strip pattern 730 to transfer the first strip pattern 720 and the second strip pattern 730 to the filling layer 800; then, the etching is performed based on the first strip pattern 720 and the second strip pattern 730 of the filling layer 800 and the first concave pattern 710a, till the stacked structure 200 is removed for a preset height; and the second concave pattern 200a defining the capacitance hole 900 is formed in the stacked structure 200, which refers to FIG. 9A to FIG. 9C. FIG. 9A illustrates a top view of the capacitor structure after the second concave pattern 200a is formed, FIG. 9B illustrates a sectional view of the capacitor structure at a dotted line L1 after the second concave pattern 200a is formed, and FIG. 9C illustrates a sectional view of the capacitor structure at a dotted line L2 after the second concave pattern 200a is formed. In the example, the silicon nitride is used to manufacture the filling layer 800, and the polysilicon is used to manufacture the first hard mask material layer. As the etching rate of the silicon nitride is more than that of the polysilicon in the etching process, at a place where the first concave pattern 710a is not crossed, the thickness of the polysilicon layer at the place where the first concave pattern 710a is not crossed is more than that of the polysilicon layer at a place where the first concave pattern 710a is crossed. Then, the remaining first hard mask layer 710 and filling layer 800 are removed, as shown in FIG. 10.

Figure 11A:
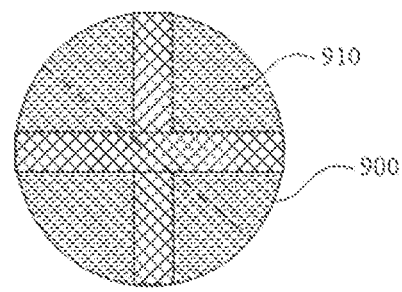
Figure 11B:
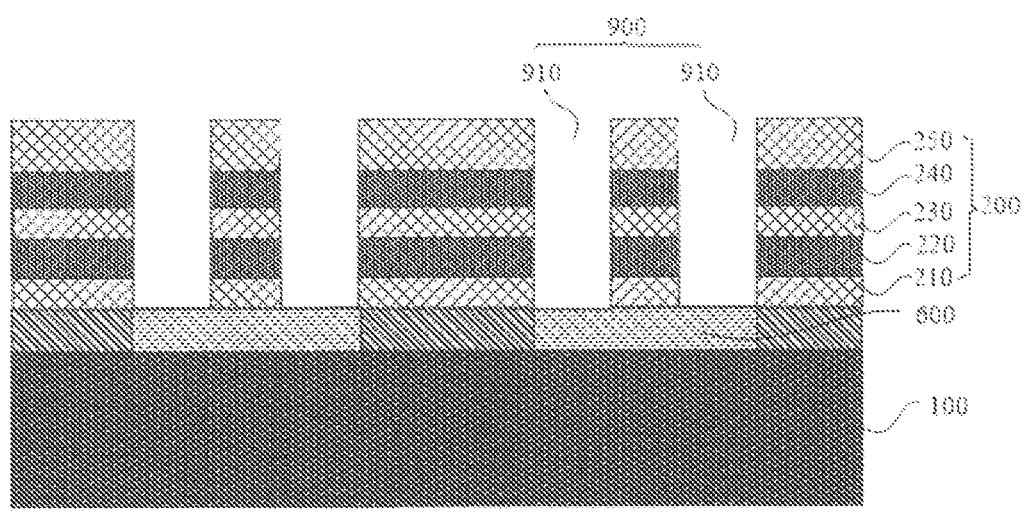

Referring to FIG. 11A and FIG. 11B, FIG. 11A illustrates a top view of the capacitance hole, and FIG. 11B illustrates a sectional view of the capacitor structure along a dotted line direction in FIG. 11A. The filling layer 800 is etched based on the second concave pattern 200a, till the capacitance contact pads 600 are exposed to form the capacitance holes 900. In an example, the through hole 910 is in a fan shape, and each of the capacitance holes 900 includes four through holes 910. In the example, the first concave pattern 710a having the cross section of circular is formed first; then, the first strip pattern 720 and the second strip pattern 730 that overlap are formed above the first concave pattern 710a, and the overlapping portion between the first strip pattern 720 and the second strip pattern 730 is located right above the first concave pattern 710a, so the section of the formed capacitance holes 900 are of the cross section of circular shape of the crossed structure.

Figure 12A:
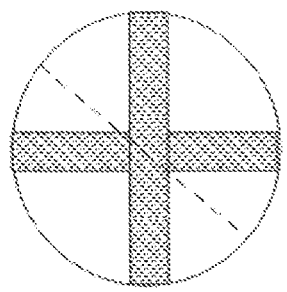
Figure 12B:
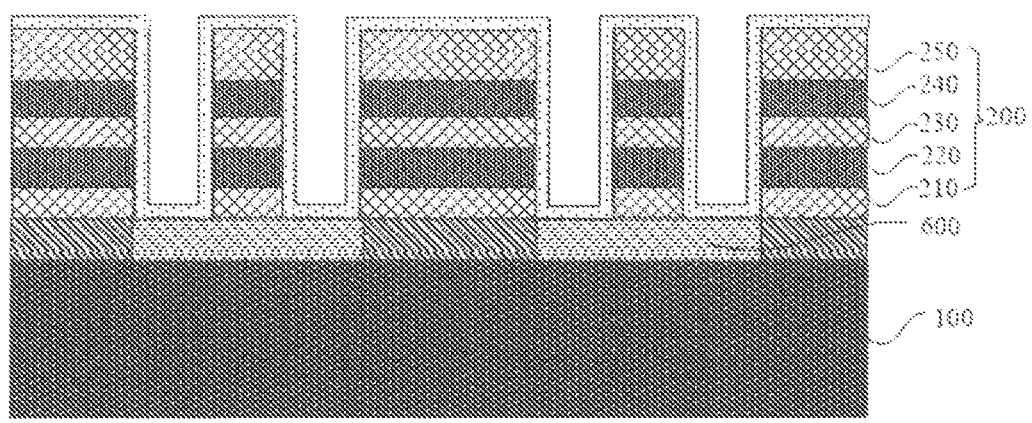

Referring to FIG. 12A and FIG. 12B, FIG. 12A illustrates a top view of the capacitance holes 900, and FIG. 12B illustrates a sectional view of the capacitor structure along a dotted line direction in FIG. 12A. After the capacitance holes 900 are formed, the conductive material is deposited by the deposition process, to form the lower electrode 300 layer covering the surface of the capacitance holes 900 and the surface of the filling layer 800.

In order to form a capacitor structure of a Three-Dimensional (3D) structure, after the lower electrode 300 is formed on the surface of the capacitance holes 900, there is a need to remove the sacrificial material layer 220 to expose the surface of the lower electrode 300 as much as possible. In an example, removing the sacrificial material layer 220 may include the following steps.

At least one opening 250a is formed in a top support material layer 250, the opening 250a being used for exposing the sacrificial material layer 220.

The sacrificial material layer 220 is removed based on the opening 250a.

Figure 13A:
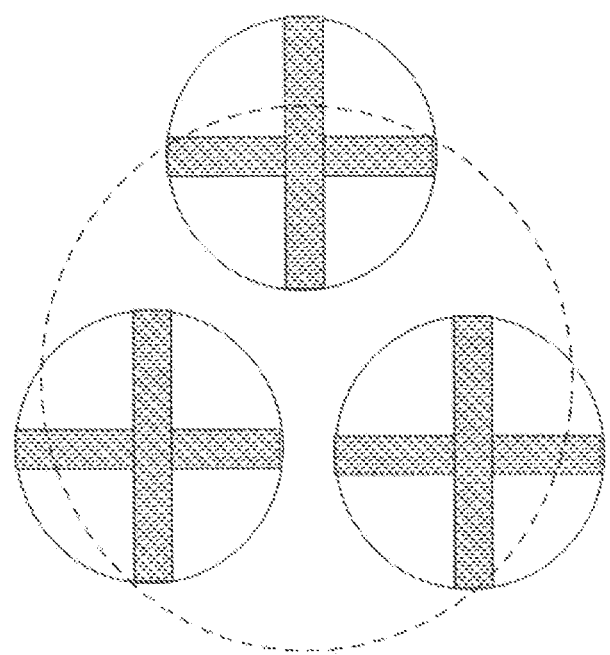
Figure 13B:
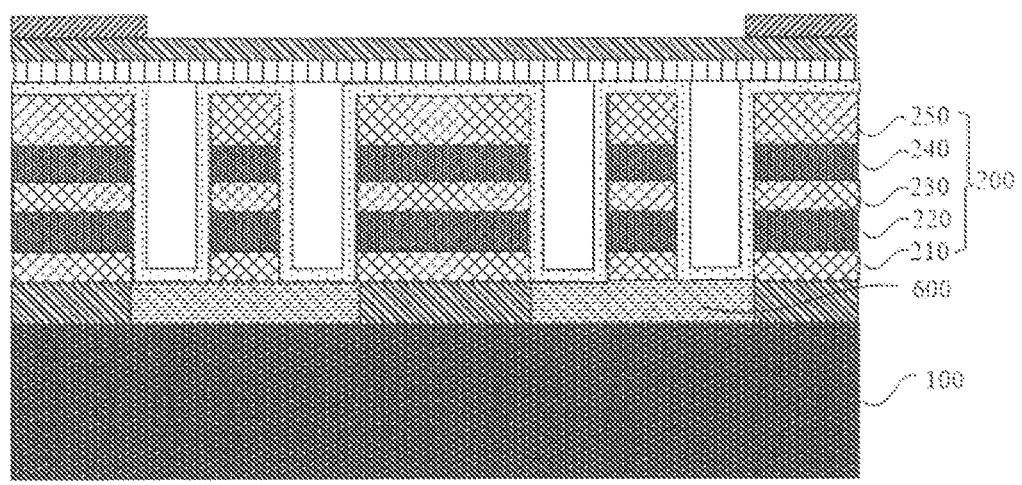
Figure 14:
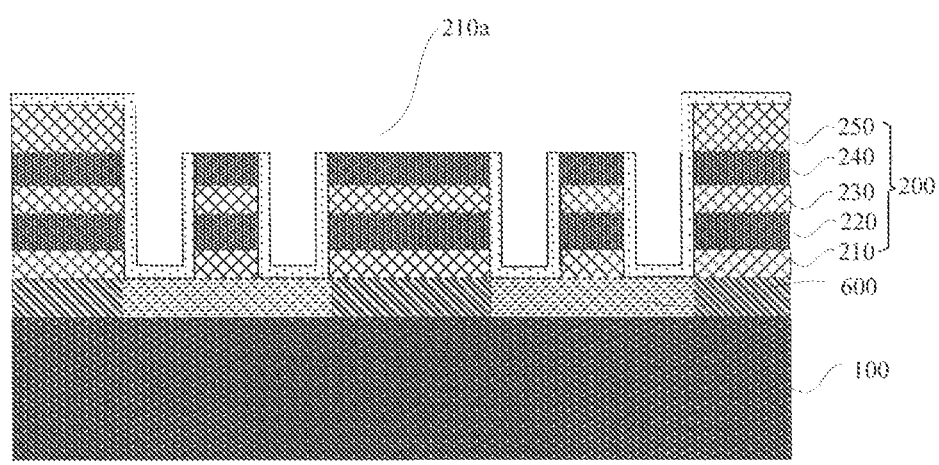

Referring to FIG. 13A, FIG. 13B and FIG. 14, FIG. 13A illustrates a schematic diagram of an arrangement of three adjacent capacitance holes 900, and FIG. 13B illustrates a sectional view of the capacitor structure along a dotted line direction in FIG. 13A. The step that the at least one opening 250a is formed in the top support material layer 250 may include that: a pattern matched with the opening 250a is formed on the top support material layer 250 with a photo-etching process; and then, with the pattern matched with the opening 250a as a mask, the top support material layer 250 is etched to form the at least one opening 250a in the top support material layer 250.

In an example, the opening 250a has a cross section of circular, triangular, quadrangular or irregular shape or the like. In the example, the opening 250a has the cross section of circular, which may be understood as that the circular pattern is beneficial to reduction of the requirements on the etching.

In an example, the opening 250a overlaps with the multiple capacitance holes 900. It is to be understood that as the capacitor structure has the relatively small size, the critical dimension of the capacitance holes 900 is also relatively small, and the space between the capacitance holes 900 is also relatively small. Therefore, by overlapping the opening 250a with the multiple capacitance holes 900, the area of the sacrificial material layer 220 exposed by the opening 250a is increased, and thus the speed for removing the sacrificial material layer 220 may be accelerated. In the example, the opening 250a overlaps with three capacitance holes 900. In addition, the opening 250a may be avoided completely overlapping with the capacitance hole 900 by controlling the diameter of the opening 250a.

In addition, the area of the exposed sacrificial material layer 220 may further be increased by forming multiple openings 250a, to accelerate the speed for removing the sacrificial material layer 220. In the specific implementation process, 2-4 openings 250a are typically designed.

In an example, the sacrificial material layer 220 is removed based on the opening 250a by using a wet etching process. In the example, the process that the sacrificial material layer 220 is removed specifically includes that: the sacrificial material layer 220 is removed through the opening 250a with hydrofluoric acid HF to form an intermediate space, to expose surfaces on two sides of the lower electrode 300. It is to be understood that when the sacrificial material layer 220 is removed with the Hydrofluoric acid (HF), as the sacrificial material layer 220 has a relatively high etching selection ratio with respect to the lower electrode 300 made of metal and the support layer made of nitride, the etching on the lower electrode 300 and the support layer may be ignored.

Figure 15:
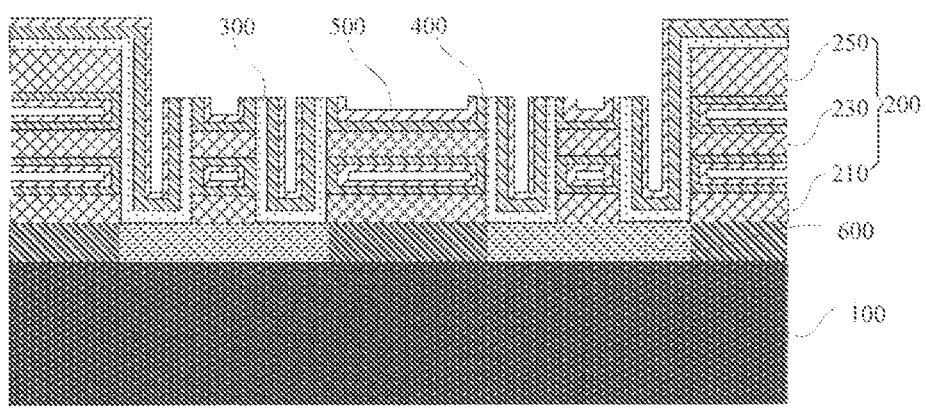

Referring to FIG. 15, after the sacrificial material is removed, a dielectric material is deposited by using the deposition process to form the capacitance dielectric layer 400. In an example, the dielectric material having the dielectric constant of more than 7 is used to manufacture the capacitance dielectric layer 400. The common high-K dielectric material includes metal oxides of $Ta_2O_5$, $TiO_2$, $Al_2O_3$, $Pr_2O_3$, $La_2O_3$, $LaAlO_3$, $HfO_2$, $ZrO_2$ or other components. Then, the conductive material is deposited by using the deposition process to form the upper electrode 500 covering the capacitance dielectric layer 400. The lower electrode 300, the capacitance dielectric layer 400 and the upper electrode 500 jointly form a double-sided capacitor.

In an example, the upper electrode 500 and the lower electrode 300 are made of one or more of titanium, titanium nitride or tungsten. In view that the titanium nitride has good stability and conductivity, both the upper electrode 500 and the lower electrode 300 in the example are made of a titanium nitride material; and meanwhile, the lower electrode 300 and the upper electrode 500 made of the same material are further beneficial to material management, simplification of process design, and reduction of production cost.

The examples of the disclosure further provide a capacitor structure. Referring to FIG. 15, the capacitor structure includes a substrate 100, a support layer 200, a lower electrode 300, a capacitance dielectric layer 400 and an upper electrode 500.

The support layer 200 is located on a surface of the substrate 100, and at least includes a top support material layer 250 and a bottom support material layer 210. Multiple capacitance holes 900 are arranged in the support layer, and each of the capacitance holes 900 includes at least three isolated through holes 910.

The lower electrode 300 is located between the top support material layer 250 and the bottom support material layer 210, and at least covers a sidewall and a bottom of the each of the through holes 910.

The capacitance dielectric layer is at least located on a surface of the lower electrode 300.

The upper electrode 500 is located on a surface of the capacitance dielectric layer 400.

In the example, the support layer further includes an intermediate support material layer 230 located between the top support material layer 250 and the bottom support material layer 210, to increase the support effect for the lower electrode 300, and prevent a warp or collapse phenomenon of the lower electrode 300. It is to be understood that as the capacitance hole 900 in the disclosure is provided with the multiple isolated through holes 910, the surface area of the lower electrode 300 may be increased, and the relative area between the lower electrode 300 and the upper electrode 500 may be increased, thereby increasing the capacitance of the capacitor. In addition, the upper electrode 500, the capacitance dielectric layer 400 and the lower electrode 300 jointly form a double-sided capacitance structure, and the relative area between the lower electrode 300 and the upper electrode 500 is further increased, thereby increasing the capacitance of the capacitor In an example, the each of the capacitance hole 900 includes four through holes 910 in a fan shape. In the example, a first strip pattern and a second strip pattern that are crossed are formed in the capacitance hole, so as to form the capacitance hole 900 including the four through holes 910 in the fan shape. In addition, three fork-shaped, five fork-shaped and eight fork-shaped patterns may further be formed in the capacitance hole to respectively form capacitance holes having three, five and eight through holes, and the specific implementation process may be designed as required.

In an example, the capacitor structure further includes capacitance contact pads 600, in which the capacitance contact pads 600 are located between the substrate 100 and the lower electrode 300, and electrically connected to the lower electrode 300. In the example, a capacitance contact plug (not illustrated) is further disposed on the substrate 100. The capacitor structure is electrically connected to the substrate through the capacitance contact plug. In the example, the capacitance contact pads are located between the capacitance contact plug and the lower electrode of the capacitor structure, and configured to reduce the contact resistance between the lower electrode 300 and the capacitance contact plug.

In an example, the capacitance dielectric layer 400 has a dielectric constant of more than 7. In the example, the dielectric material having the dielectric constant of more than 7 is used to manufacture the capacitance dielectric layer 400, so as to increase the capacitance by increasing the dielectric coefficient of the capacitance dielectric layer 400 between the upper electrode 500 and the lower electrode 300. The common high-K dielectric material includes metal oxides of $Ta_2O_5$, $TiO_2$, $Al_2O_3$, $Pr_2O_3$, $La_2O_3$, $LaAlO_3$, $HfO_2$, $ZrO_2$ or other components.

In an example, both the lower electrode 300 and the upper electrode 500 are metal electrodes. The lower electrode 300 and the upper electrode 500 are made of one or more of titanium, titanium nitride or tungsten. In view that the titanium nitride has good stability and conductivity, both the lower electrode 300 and the upper electrode 500 in the example are made of a titanium nitride material; and meanwhile, the lower electrode 300 and the upper electrode 500 made of the same material are further beneficial to material management, simplification of process design, and reduction of production cost.

The examples of the disclosure further provide a memory, which uses the capacitor structure as described in the above any example.

Reference in the specification to "some examples", "other examples", "ideal example" and the like means that a particular feature, structure, material or characteristic described in connection with the examples or examples is included in at least one example or example of the disclosure. In the specification, the schematic descriptions on the above terms unnecessarily refer to the same examples or example.

The technical features of the above examples may be combined freely. In order to describe briefly, the descriptions are not made on all possible combinations of the technical features of the examples. However, the combinations of these technical features should be viewed as a scope of the specification as long as there is no conflict.

The above examples only describe several implementation modes of the disclosure. The description is specific and detailed, but cannot be understood as a limit to a scope of the disclosure accordingly. It should be pointed out that those of ordinary skill in the art may further make multiple changes and improvements without departing from a concept of the disclosure and those also belong to the protection scope of the disclosure. Therefore, the protection scope of the disclosure shall be subjected to the appended claims.

The invention claimed is:

1. A method for manufacturing a capacitor structure, comprising:
   providing a substrate;
   forming a stacked structure on the substrate, the stacked structure comprising at least two support material layers arranged at an interval and a sacrificial material layer located between adjacent support material layers;
   forming capacitance holes in the stacked structure, each of the capacitance holes comprising at least three through holes arranged in isolation;
   forming a lower electrode, the lower electrode at least covering a side wall and a bottom of each of the through holes;
   removing the sacrificial material layer, and forming a capacitance dielectric layer on a surface of the lower electrode; and
   forming an upper electrode on a surface of the capacitance dielectric layer.

2. The method for manufacturing the capacitor structure of claim 1, wherein a step of forming the capacitance holes in the stacked structure comprises:
   forming a first hard mask layer on the stacked structure, the first hard mask layer forming a first concave pattern, and the first concave pattern defining an external outline of the capacitance hole;
   forming a filling layer, the filling layer covering a surface of the first hard mask layer and filling up the first concave pattern;
   forming a first strip pattern and a second strip pattern that overlap on the filling layer, and enabling an overlapping portion between the first strip pattern and the second strip pattern to be located above the first concave pattern;
   etching the filling layer, the first hard mask layer and the stacked structure based on the first concave pattern, the first strip pattern and the second strip pattern, till the stacked structure is removed for a preset height; and forming a second concave pattern defining the capacitance hole in the stacked structure; and
   etching the filling layer based on the second concave pattern to form the capacitance hole.

3. The method for manufacturing the capacitor structure of claim 2, wherein a step of forming the first hard mask layer comprises:
   forming a first hard mask material layer, a first organic mask material layer and a first photoresist layer on a surface of the stacked structure;
   patterning the first photoresist layer, and forming a target pattern defining the first concave pattern in the first photoresist layer;
   etching the first organic mask material layer and the first hard mask material layer with the first photoresist layer as a mask, a retaining portion of the first hard mask material layer forming the first hard mask layer; and
   removing the first organic mask material layer and the first photoresist layer.

4. The method for manufacturing the capacitor structure of claim 2, wherein a step of forming the first strip pattern and the second strip pattern comprises:
   sequentially forming a second organic mask material layer and a second hard mask material layer on the filling layer;
   patterning the second hard mask material layer to form the first strip pattern extending in a first direction;
   sequentially forming a third organic mask material layer and a third hard mask material layer on the second hard mask material layer; and
   patterning the third hard mask material layer to form the second strip pattern extending in a second direction, wherein there is a included angle between the first direction and the second direction.

5. The method for manufacturing the capacitor structure of claim 1, wherein the through hole is in a fan shape, and each of the capacitance holes comprises four through holes.

6. The method for manufacturing the capacitor structure of claim 2, wherein the first concave pattern has a cross section of circular, and lines for connecting centers of three first concave patterns adjacent to each other form an equilateral triangle.

7. The method for manufacturing the capacitor structure of claim 1, wherein a step of removing the sacrificial material layer comprises:
   forming at least one opening in a top support material layer, the opening being used for exposing the sacrificial material layer; and
   removing the sacrificial material layer based on the opening.

8. The method for manufacturing the capacitor structure of claim 7, wherein the opening has a cross section of circular, triangular, quadrangular or irregular shape.

9. The method for manufacturing the capacitor structure of claim 7, wherein the sacrificial material layer is removed based on the opening by using a wet etching process.

10. The method for manufacturing the capacitor structure of claim 1, further comprising:
   forming capacitance contact pads on the substrate before forming the stacked structure, wherein the capacitance contact pads correspond to the capacitance holes one by one.

11. A capacitor structure, comprising:
   a substrate;
   a support layer, located on a surface of the substrate, and at least comprising a top support material layer and a bottom support material layer, a plurality of capacitance holes being arranged in the support layer, and each of the capacitance holes comprising at least three isolated through holes;
   a lower electrode, located between the top support material layer and the bottom support material layer, and at least covering a sidewall and a bottom of the each of the through holes;
   a capacitance dielectric layer, at least located on a surface of the lower electrode; and
   an upper electrode, located on a surface of the capacitance dielectric layer.

12. The capacitor structure of claim 11, wherein the each of the capacitance hole comprises four through holes in a fan shape.

13. The capacitor structure of claim 11, further comprising capacitance contact pads, wherein the capacitance contact pads are located between the substrate and the lower electrode, and electrically connected to the lower electrode.

14. The capacitor structure of claim 11, wherein the capacitance dielectric layer has a dielectric constant of more than 7.

15. The capacitor structure of claim 11, wherein both the lower electrode and the upper electrode are metal electrodes.

16. A memory, using a capacitor structure, the capacitor structure comprising:
   a substrate;
   a support layer, located on a surface of the substrate, and at least comprising a top support material layer and a bottom support material layer, a plurality of capacitance holes being arranged in the support layer, and each of the capacitance holes comprising at least three isolated through holes;
   a lower electrode, located between the top support material layer and the bottom support material layer, and at least covering a sidewall and a bottom of each of the through holes;
   a capacitance dielectric layer, at least located on a surface of the lower electrode; and
   an upper electrode, located on a surface of the capacitance dielectric layer.

17. The memory of claim 16, wherein the each of the capacitance holes comprises four through holes in a fan shape.

18. The memory of claim 16, further comprising capacitance contact pads, wherein the capacitance contact pads are located between the substrate and the lower electrode, and electrically connected to the lower electrode.

19. The memory of claim 16, wherein the capacitance dielectric layer has a dielectric constant of more than 7.

20. The memory of claim 16, wherein both the lower electrode and the upper electrode are metal electrodes.

* * * * *